United States Patent
Liu et al.

[11] Patent Number: 6,140,218
[45] Date of Patent: Oct. 31, 2000

[54] METHOD FOR FABRICATING A T-SHAPED HARD MASK/CONDUCTOR PROFILE TO IMPROVE SELF-ALIGNED CONTACT ISOLATION

[75] Inventors: Jen-Cheng Liu, Chia-Yih; Li-Chih Chao, Tao-yuan; Huan-Just Lin; Yung-Kuan Hsiao, both of Hsin-Chu, all of Taiwan

[73] Assignee: Taiwan Semiconductor Manufacturing Company, Hsin-Chu, Taiwan

[21] Appl. No.: 09/329,782

[22] Filed: Jun. 10, 1999

[51] Int. Cl.[7] .................................................. H01L 21/44
[52] U.S. Cl. ......................... 438/597; 438/585; 438/588; 438/591; 438/592; 438/595
[58] Field of Search ..................... 438/585, 588, 438/591, 592, 595–597

[56] References Cited

U.S. PATENT DOCUMENTS

| | | | |
|---|---|---|---|
| 4,795,718 | 1/1989 | Beitman | 437/41 |
| 5,053,849 | 10/1991 | Izawa et al. | 357/59 |
| 5,139,968 | 8/1992 | Hagase et al. | 437/175 |
| 5,316,616 | 5/1994 | Nakamura et al. | 156/643 |
| 5,407,870 | 4/1995 | Okada et al. | 437/2.1 |
| 5,491,100 | 2/1996 | Lee et al. | 437/41 |
| 5,545,578 | 8/1996 | Park et al. | 437/44 |
| 5,698,072 | 12/1997 | Fukuda | 156/653.1 |
| 5,766,993 | 6/1998 | Tseng | 438/253 |
| 5,915,198 | 6/1999 | Ko et al. | 438/592 |

*Primary Examiner*—John F. Niebling
*Assistant Examiner*—Lynne Gurley
*Attorney, Agent, or Firm*—George O. Saile; Stephen B. Ackerman; William J. Stoffel

[57] ABSTRACT

The present invention provides a method of fabricating a T-shaped hard mask/conductive pattern profile and a process of etching a self-aligned contact opening using a T-shaped hard mask/conductive pattern profile to improve the self-aligned contact isolation. The process begins by forming a polysilicon or more preferably a polysilicon/silicide conductive layer over a semiconductor substrate. A silicon oxynitride hard mask layer is formed over the conductive layer. The silicon oxynitride hard mask layer is patterned to form a hard mask pattern. The conductive layer is patterned to form a conductive pattern in a three step etch using $Cl_2$ and HBr chemistry. The silicon oxynitride hard mask releases oxygen during the conductive layer etch resulting in a T-shaped hard mask/conductive pattern profile (e.g. the width of the hard mask is greater than the width of the conductive pattern after etching). In a preferred embodiment, the a T-shaped hard mask/conductive pattern profile is used to form a self-aligned contact for a capacitor over bitline structure.

14 Claims, 3 Drawing Sheets

METHOD FOR FABRICATING A T-SHAPED HARD MASK/CONDUCTOR PROFILE TO IMPROVE SELF-ALIGNED CONTACT ISOLATION

BACKGROUND OF INVENTION

1) Field of the Invention

This invention relates generally to fabrication of semiconductor devices and more particularly to a process for fabricating a T-shaped hard mask/conductor profile and a process of etching a self-aligned contact opening using a T-shaped hard mask/conductor profile to improve self-aligned contact isolation such as for a capacitor node.

2) Description of the Prior Art

In semiconductor fabrication, self-aligned contacts have gained wide use because they eliminate a photolithography step, increasing manufacturing efficiency and, more importantly, allowing for increased device density by eliminating the need for alignment alowances. A self-aligned contact is typically formed by fabricating spacers on the sidewalls of a conductive pattern (e.g. gate, bit line, etc) and on the sidewall of an overlying hard mask. The spacer, which can be composed of a dielectric, ussually silicon dioxide or silicon nitride provides electrical isolation between the contact and the conductive pattern.

As device density increases the horizontal spacing must decrease, and the thickness of the dielectric spacer must get smaller. As the dielectric spacer becomes smaller, the risk of bridging (forming a conductive path from the contact to the conductive pattern) increases. Leakage current also increases. As a result the performance and reliability of the semiconductor device is adversely effected.

The importance of overcoming the various deficiencies noted above is evidenced by the extensive technological development directed to the subject, as documented by the relevant patent and technical literature. The closest and apparently more relevant technical developments in the patent literature can be gleaned by considering the following Patents.

U.S. Pat. No. 5,139,968 (Hayase et al.) teaches a method for forming a T-shaped gate electrode.

U.S. Pat. No. 5,407,870 (Okada et al.) discloses a process for forming a SiON layer.

U.S. Pat. No. 5,766,993 (Tseng) discloses a process for forming a poly gate and contact.

SUMMARY OF THE INVENTION

It is an object of the present invention to provide a method for fabricating a T-shaped hard mask/conductor profile.

It is another object of the present invention to provide improved isolation during self-aligned contact formation.

To accomplish the above objectives, the present invention provides a method of fabricating a T-shaped hard mask/conductor profile and a process of forming a self-aligned contact opening using a T-shaped hard mask/conductor profile to improve the self-aligned contact isolation. A preferred embodiment is to use the T-shaped hard mask/conductor profile to improve SAC formation for a capacitor node.

The process begins by forming a polysilicon or more preferably a polycide conductive layer over a semiconductor substrate. A silicon oxynitride hard mask layer is formed over the conductive layer. The silicon oxynitride hard mask layer is patterned to form a hard mask pattern. The conductive layer is patterned to form a conductive pattern in a three step etch using $Cl_2$ and HBr chemistry. The silicon oxynitride hard mask releases oxygen during the conductive layer etch resulting in a T-shaped hard mask/conductive pattern profile (e.g. the width of the hard mask is greater than the width of the conductive pattern after etching).

To form a self-aligned contact opening, spacers are formed on the sidewalls of the conductive pattern and the hardmask using conventional deposition and etch back techniques. The resulting self-aligned contact opening has an increased isolation window in the horizontal direction.

The present invention provides considerable improvement over the prior art. A key advantage of the invention is that during the conductive layer etch, Oxygen is released from the Silicon Oxynitride hard mask, reducing polymer passivation of the underlying conductive layers (preferably tungsten silicide and polysilicon). The reduced polymer passivation causes the conductive pattern width to be smaller than the hard mask pattern width, resulting in a T-shaped hard mask/conductive pattern profile as shown in FIG. 3. This profile causes the spacer to be thicker between the conductive pattern and the self-aligned contact, increasing the isolation window in the horizontal direction during self-aligned contact etch.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method of fabricating a T-shaped hard mask/conductive pattern profile and a process of etching a self-aligned contact opening using a T-shaped hard mask/conductive pattern profile to improve the self-aligned contact isolation.

Substrate, as used in the following description means a silicon substrate suitable for use in manufacturing an integrated circuit. The substrate may have already undergone one or more processing steps, including any steps previously described herein.

Conductive pattern, as used in the following description means a conductive part of a device such as a gate electrode or a bit line. Conductor is used synonymously with conductive pattern herein.

Figure 1:
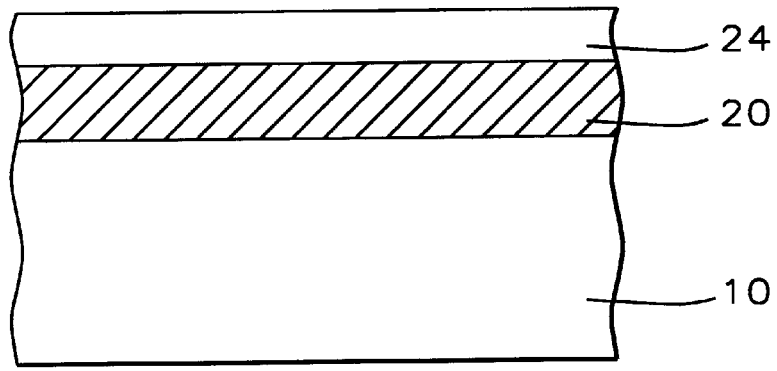
FIGS. 1, 2 & 3 illustrate sequential cross-sectional views of the present invention's process for forming a T-shaped hard mask/conductive pattern profile.

Referring to FIG. 1, the process begins by providing a substrate (10) having a conductive layer (20) thereon. Additional insulating and/or conductive layers and or devices can be on the substrate under the conductive layer (20). The conductive layer is preferably composed of Tungsten Silicide layer having a thickness of between about 800 Angstroms and 1500 Angstroms, and more preferably between about 1000 Angstroms and 1500 Angstroms on a Polysilicon layer having a thickness of between about 80 Angstroms and 1500 Angstroms, and more preferably between about 1000 Angstroms and 1500 Angstroms. The conductive layer and the underlying layers and devices are formed using methods known in the art.

Still referring to FIG. 1, a hard mask layer (24) is formed on the conductive layer (20). The hard mask is composed of $Si_xO_yN_z$ (Silicon Oxynitride), where x is between 0 and 1, y is between 0 and 1, and z is between 0 and 1. The hard mask can be formed by one of several techniques known in the art, including chemical vapor deposition or plasma enhanced chemical vapor deposition. To prevent $WSi_x$ thermal diffusion during SiON deposition, the hard mask layer (24) is preferably formed using chemical vapor deposition.

Figure 2:
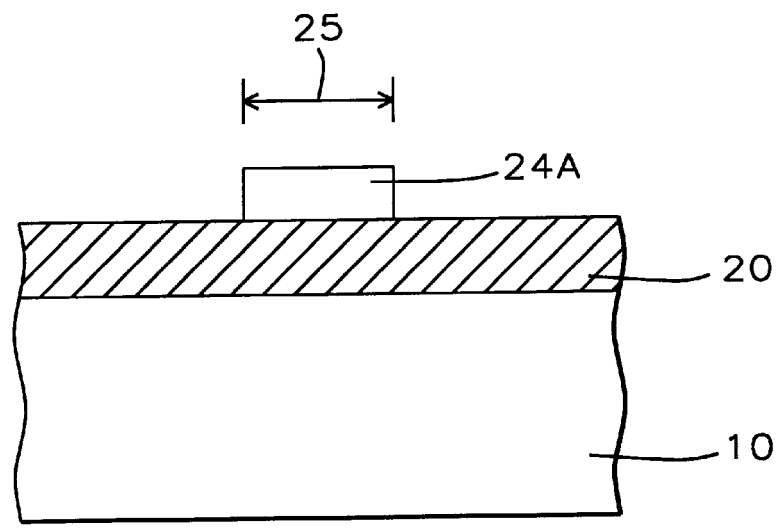

Referring to FIG. 2, the hard mask layer (24) is patterned to form a hard mask pattern (24A). The hard mask pattern has a hard mask pattern width (25) of between about 0.3 microns and 0.6 microns.

Figure 3:
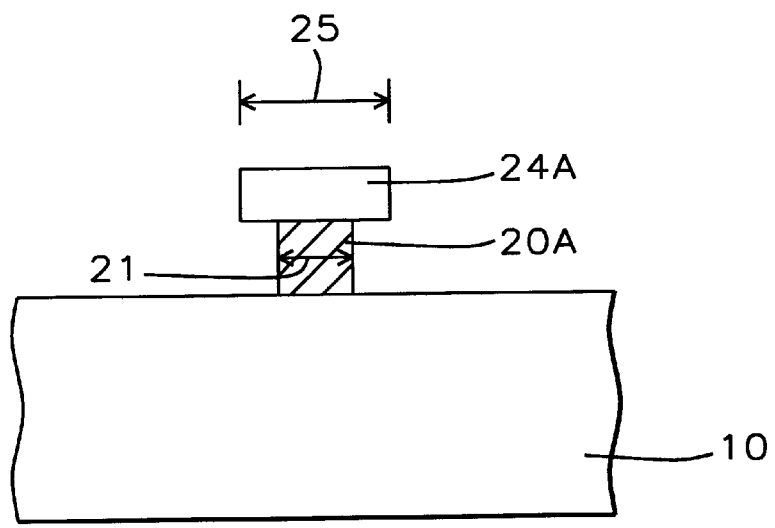

Referring to FIG. 3, in a key step, the conductive layer (20) is etched to form a conductive pattern (20A) having a conductive pattern width (21) using a three step process. In the first step, a Tungsten Silicide etch is performed using a $Cl_2$ and $He\text{—}O_2$. The flow rate ratio of $Cl_2$ to $He\text{—}O_2$ is between about 40 and 50, and the ratio of He to $O_2$ is between 40 and 45. The first etch step is performed at a pressure of between about 3 mTorr and 6 mTorr and a power of between about 150 W and 250 W. The first etch step is continued to the Tungsten Silicide endpoint. In the second step, a polysilicon etch is performed using a $Cl_2$, HBr, and $He\text{—}O_2$. The flow rate ratio of $Cl_2$ to HBr is between about 0.5 and 1.0. The flow rate ratio of $Cl_2$ to $He\text{—}O_2$ is between about 1.0 and 2.5, and the ratio of He to $O_2$ is between about 40 and 45. The second etch step is performed at a pressure of between about 15 mTorr and 25 mTorr; and a power of between about 200 W and 300 W for a time of between about 8 seconds and 15 seconds. In the third step, an overetch is performed using a $He\text{—}O_2$, HBr, and He. The flow rate ratio of $He\text{—}O_2$ to HBr is between about 0.008 and 0.015, and the flow rate ratio of $He\text{—}O_2$ to He is between about 0.015 and 0.03. The ratio of He to $O_2$ in the $He\text{—}O_2$ is between about 75 and 85. The third etch step is performed at a pressure of between about 50 mTorr and 70 mTorr; and a power of between about 200 W and 300 W; for a time of between about 60 seconds and 80 seconds. For example, the following recipe can be used to etch a T-shaped oxynitride hard mask/poly-$WSi_x$ conductive layer profile:

step 1 WSix: 4mt/200TCP/100bot/90C12/2He—O2/ endpt OE=40% step 2 Poly: 20mt/250TCP/150bot/80C12/120HBr/50He—O2/10"

step 3 OE: 60mt/250TCP/150bot/2He—O2/200HBr/100He/70"

The three step etch is preferably performed in a high density plasma etcher using a high density plasma mode.

A key advantage of the invention is that during the conductive layer etch, Oxygen is released from the Silicon Oxynitride hard mask, reducing polymer passivation of the underlying tungsten silicide and polysilicon layers. The reduced polymer passivation causes the conductive pattern width (21) to be smaller than the hard mask pattern width (25), resulting in a T-shaped hard mask/conductive pattern profile as shown in FIG. 3. For a gate electrode, the hard mask pattern width (25) is between about 0.25 microns and 0.35 microns, and the conductive pattern width (21) is between about 15 Angstroms and 25 Angstroms smaller than the hard mask pattern width (25). For a bit line, the hard mask pattern width (25) is between about 0.25 microns and 0.35 microns, and the conductive pattern width (21) is between about 15 Angstroms and 25 Angstroms smaller than the hard mask pattern width (25).

Figure 4:
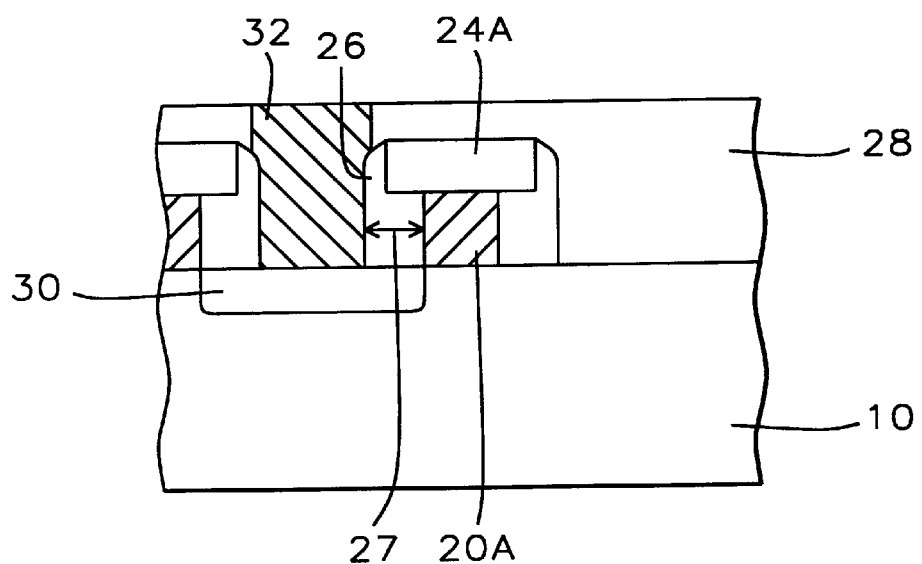
FIGS. 4 illustrates a cross-sectional view of a semiconductor device using the process of the present invention to provide improved isolation between a gate electrode and a self-aligned contact.

FIG. 4 shows a device having a T-shaped hard mask (24A)/conductive pattern (20A) profile according to the present invention. After forming the T-shaped hard mask (24A)/conductive pattern (20A) profile according to the present invention over a substrate (10), dielectric spacers (26) are formed on the sidewalls of the hard mask (24A) and the conductive pattern (20A). A dielectric layer (28) is formed over the hard mask (24A) and substrate (10). The dielectric layer is patterned to form an openings adjacent to the dielectric spacers (26). Ions are implanted into the substrate (10) through the opening to form a doped region (30). A self-aligned contact (32) is formed in the opening to provide contact to the doped region (30). Because of the T-shaped hard mask (24A)/conductive pattern (20A) profile, the distance (27) between the conductive pattern (20A) and the self-aligned contact (32) is greater than if the hard mask (24A)/conductive pattern (20A) profile were vertical.

Figure 5:
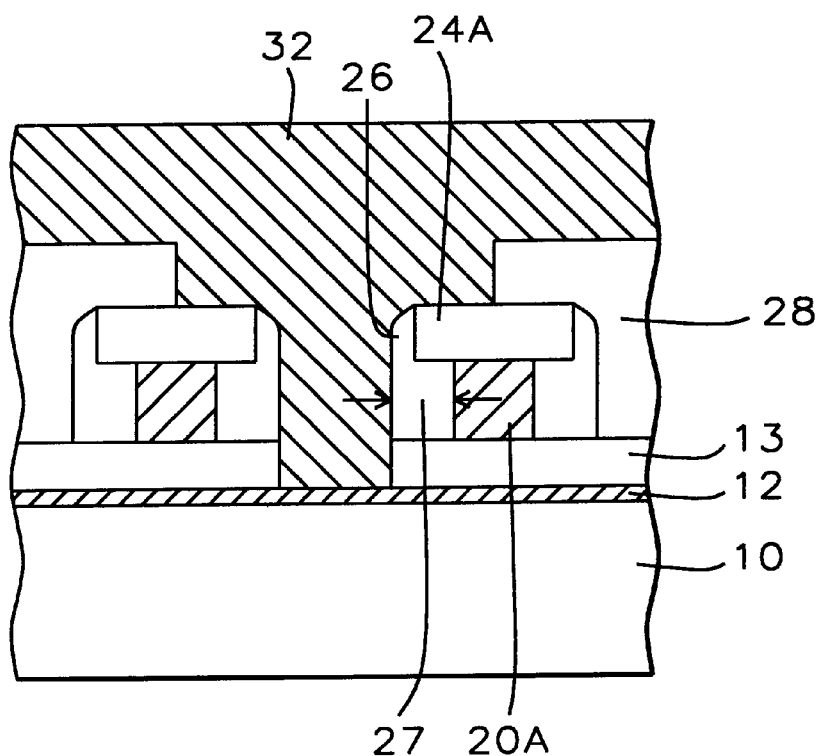
FIG. 5 illustrates a preferred embodiment of the invention wherein a T-shaped hard mask/conductive pattern profile is used to form a self-aligned contact for a capacitor over bitline structure.

FIG. 5 shows a capacitor over bit-line device having a T-shaped hard mask (24A)/conductive pattern (20A) profile according to the present invention. A substrate (10) is provided having a lower conductive pattern (12) and an intermediate dielectric layer (13) thereover, as is known in the art. After forming the T-shaped hard mask (24A)/conductive pattern (20A) profile according to the present invention over the intermediate dielectric layer (13), dielectric spacers (26) are formed on the sidewalls of the hard mask (24A) and the conductive pattern (20A). A dielectric layer (28) is formed over the hard mask (24A) and intermediate dielectric layer (13). The dielectric layer and intermediate dielectric layer are patterned to form an opening adjacent to the dielectric spacers (26). A self-aligned contact (32) is formed in the opening to provide contact to the lower conductive layer (12). Because of the T-shaped hard mask (24A)/conductive pattern (20A) profile, the distance (27) between the conductive pattern (20A) and the self-aligned contact (32) is greater than if the hard mask (24A)/conductive pattern (20A) profile were vertical.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a T-shaped hard mask/conductive pattern profile comprising the steps of:

a) providing a substrate having thereover a conductive layer; said conductive layer comprising a polysilicon layer with an overlying tungsten silicide layer;

b) forming a hard mask layer on said conductive layer; said hard mask layer comprising silicon oxynitride;

c) patterning said hard mask layer to form a hard mask pattern having a hard mask pattern width; and d) etching said conductive layer to form a conductive pattern having a conductive pattern width which is smaller than said hard mask pattern width using a $Cl_2$ and $He$—$O_2$ chemistry without a Br-containing gas to etch said tungsten silicide layer and using a $Cl_2$, HBr, and $He$—$O_2$ chemistry to etch said polysilicon layer; thereby increasing a self-aligned contact window and improving a self-aligned contact isolation.

2. The method of claim 1 wherein the conductive pattern is a gate electrode.

3. The method of claim 1 wherein the conductive pattern is a bit line.

4. The method of claim 1 wherein the conductive pattern is a bit line in a capacitor over bit line structure.

5. The method of claim 1 wherein said conductive pattern has a width of between about 15 Angstroms and 25 Angstroms smaller than said hard mask pattern width.

6. The method of claim 1 wherein said hard mask consists of $Si_XO_YN_Z$ (silicon oxynitride), where X is between 0 and 1, Y is between 0 and 1, and Z is between 0 and 1.

7. The method of claim 1 wherein said conductive layer is etched using a three step process comprising:

a first step using $Cl_2$ and $He$—$O_2$ with a $Cl_2$ to $He$—$O_2$ flow rate ratio of between about 40 and 50 (with a ratio of He to $O_2$ of between 40 and 45) performed at a pressure of between about 3 mTorr and 6 mTorr and a power of between about 150 W and 250 W continued to the tungsten silicide endpoint;

a second step using $Cl_2$, HBr, and $He$—$O_2$ with a $Cl_2$ to HBr flow rate ratio of between about 0.5 and 1.0, and a $Cl_2$ to $He$—$O_2$ flow rate ratio of between about 1.0 and 2.5 (with a ratio of He to $O_2$ of between 40 and 45) performed at a pressure of between about 15 mTorr and 25 mTorr and a power of between about 200 W and 300 W for a time of between about 60 seconds and 80 seconds; and a third step using $He$—$O_2$, HBr, and He with a $He$—$O_2$ to HBr flow rate ratio of between about 0.008 and 0.015 and a $He$—$O_2$ to He flow rate ratio of between about 0.015 and 0.03 (with a ratio of He to $O_2$ of between 75 and 85) performed at a pressure of between about 50 mTorr and 70 mTorr and a power of between about 200 W and 300 W for a time of between about 60 seconds and 80 seconds.

8. A method for fabricating a T-shaped hard mask/conductive pattern profile in a capacitor over bit line structure, comprising the steps of:

a) providing a substrate having a lower conductive pattern and an intermediate dielectric layer thereover; said intermediate dielectric layer having a conductive layer thereover; said conductive layer comprising tungsten silicide over polysilicon;

b) forming a hard mask layer on said conductive layer; said hard mask layer consisting of $Si_XO_YN_Z$, where X is between 0 and 1, Y is between 0 and 1, and Z is between 0 and 1;

c) patterning said hard mask layer to form a hard mask pattern having a hard mask pattern width;

d) etching said conductive layer to form a conductive pattern having a conductive pattern width which is smaller than said hard mask pattern width using a three step process comprising:

a first step using $Cl_2$ and $He$—$O_2$ with a $Cl_2$ to $He$—$O_2$ flow rate ratio of between about 40 and 50 (with a ratio of He to $O_2$ of between 40 and 45) performed at a pressure of between about 3 mTorr and 6 mTorr and a power of between about 150 W and 250 W continued to the tungsten silicide endpoint;

a second step using $Cl_2$, HBr, and $He$—$O_2$ with a $Cl_2$ to HBr flow rate ratio of between about 0.5 and 1.0, and a $Cl_2$ to $He$—$O_2$ flow rate ratio of between about 1.0 and 2.5 (with a ratio of He to $O_2$ of between 40 and 45) performed at a pressure of between about 15 mTorr and 25 mTorr and a power of between about 200 W and 300 W for a time of between about 60 seconds and 80 seconds; and a third step using $He$—$O_2$, HBr, and He with a $He$—$O_2$ to HBr flow rate ratio of between about 0.008 and 0.015 and a $He$—$O_2$ to He flow rate ratio of between about 0.015 and 0.03 (with a ratio of He to $O_2$ of between 75 and 85) performed at a pressure of between about 50 mTorr and 70 mTorr and a power of between about 200 W and 300 W for a time of between about 60 seconds and 80 seconds;

e) forming dielectric spacers on the sidewalls of said hard mask pattern and said conductive pattern;

f) forming a dielectric layer over said hard mask pattern and said intermediate dielectric layer;

g) patterning said dielectric layer and said intermediate dielectric layer to form an opening adjacent to said dielectric spacers; and h) forming a self-aligned contact in said opening; said self-aligned contact providing contact to said lower conductive pattern.

9. The method of claim 8 wherein said tungsten silicide layer of said conductive layer has a thickness of between about 1000 Angstroms and 1500 Angstroms and said polysilicon layer of said conductive layer has a thickness of between about 1000 Angstroms and 1500 Angstroms.

10. The method of claim 8 wherein said hard mask pattern has a width of between about 0.25 microns and 0.35 microns and said conductive pattern has a width of between about 15 Angstroms and 25 Angstroms smaller than said hard mask pattern width.

11. A process of etching a self-aligned contact opening using a T-shaped hard mask/conductive pattern profile to improve self-aligned contact isolation, comprising the steps of:

a) providing a substrate having thereover a conductive layer; said conductive layer comprising a tungsten silicide layer over a polysilicon layer;

b) forming a hard mask layer on said conductive layer; said hard mask layer consisting of silicon oxynitride;

c) patterning said hard mask layer to form a hard mask pattern having a hard mask pattern width;

d) etching said conductive layer to form a conductive pattern having sidewalls and having a conductive pattern width which is smaller than said hard mask pattern width using a three step process comprising:

a first step using $Cl_2$ and $He$—$O_2$ with a $Cl_2$ to $He$—$O_2$ flow rate ratio of between about 40 and 50 (with a ratio of He to $O_2$ of between 40 and 45) performed at a pressure of between about 3 mTorr and 6 mTorr and a power of between about 150 W and 250 W continued to the tungsten silicide endpoint;

a second step using $Cl_2$, HBr, and $He$—$O_2$ with a $Cl_2$ to HBr flow rate ratio of between about 0.5 and 1.0, and a $Cl_2$ to $He$—$O_2$ flow rate ratio of between about 1.0 and 2.5 (with a ratio of He to $O_2$ of between 40 and 45) performed at a pressure of between about 15 mTorr and 25 mTorr and a power of between about 200 W and 300 W for a time of between about 60 seconds and 80 seconds; and a third step using He—O$_2$, HBr, and He with a He—O$_2$ to HBr flow rate ratio of between about 0.008 and 0.015 and a He—O$_2$ to He flow rate ratio of between about 0.015 and 0.03 (with a ratio of He to O$_2$ of between 75 and 85) performed at a pressure of between about 50 mTorr and 70 mTorr and a power of between about 200 W and 300 W for a time of between about 60 seconds and 80 seconds;

e) forming spacers on said sidewalls of said conductive pattern; and f) forming self-aligned contacts adjacent to said spacers.

12. The method of claim 11 wherein said tungsten silicide layer of said conductive layer has a thickness of between about 1000 Angstroms and 1500 Angstroms and said polysilicon layer of said conductive layer has a thickness of between about 1000 Angstroms and 1500 Angstroms.

13. The method of claim 11 wherein said hard mask pattern has a width of between about 0.25 microns and 0.35 microns and said conductive pattern has a width of between about 15 Angstroms and 25 Angstroms smaller than said hard mask pattern width.

14. The method of claim 11 wherein said hard mask layer consisting of $Si_XO_YN_Z$, where X is between 0 and 1, Y is between 0 and 1, and Z is between 0 and 1.

* * * * *